United States Patent
Issakov et al.

(10) Patent No.: US 9,537,457 B2
(45) Date of Patent: Jan. 3, 2017

(54) HIGH LINEARITY PUSH-PULL COMMON-GATE AMPLIFIER

(71) Applicant: Intel IP Corporation, Santa Clara, CA (US)

(72) Inventors: Vadim Issakov, Duesseldorf (DE); Konrad Hirsch, Blaustein (DE); Herbert Stockinger, Schliersee (DE); Harald Doppke, Muelheim an der Ruhr (DE)

(73) Assignee: Intel IP Corporation, Santa Clara, CA (US)

( * ) Notice: Subject to any disclaimer, the term of this patent is extended or adjusted under 35 U.S.C. 154(b) by 2 days.

(21) Appl. No.: 14/629,793

(22) Filed: Feb. 24, 2015

(65) Prior Publication Data

US 2016/0248390 A1 Aug. 25, 2016

(51) Int. Cl.
*H03F 3/26* (2006.01)
*H03F 1/02* (2006.01)

(52) U.S. Cl.
CPC .......... *H03F 3/265* (2013.01); *H03F 1/0216* (2013.01); *H03F 1/0233* (2013.01); *H03F 2200/121* (2013.01); *H03F 2200/294* (2013.01); *H03F 2203/30027* (2013.01); *H03F 2203/30063* (2013.01)

(58) Field of Classification Search
CPC ................................. H03F 3/26; H03F 3/301
USPC ................. 330/264, 265, 269, 270
See application file for complete search history.

(56) References Cited

U.S. PATENT DOCUMENTS

2009/0033423 A1\* 2/2009 Cho ........................ H03F 3/301
330/264

OTHER PUBLICATIONS

C.J. Jeong, et al.; "A 1.5V, 140uA CMOS Ultra-Low Power Common-Gate LNA"; 2011 IEEE, p. 1-4.

\* cited by examiner

*Primary Examiner* — Steven J Mottola
(74) *Attorney, Agent, or Firm* — Eschweiler & Associates, LLC

(57) ABSTRACT

An amplifier operates to provide a high output impedance at an output through a push stage having a first transistor of a first transistor type and a pull stage having a second transistor of a second transistor type that is different from the first transistor type. The first transistor and the second transistor are coupled in a common-gate configuration. The first transistor and the second transistor are shorted together via a capacitor coupled to an input and share a common current path as a push-pull current-reusing common-gate low noise amplifier with a broadband input matching.

19 Claims, 9 Drawing Sheets

HIGH LINEARITY PUSH-PULL COMMON-GATE AMPLIFIER

FIELD

The present disclosure relates to an amplification arrangement, and more specifically, a push-pull common-gate amplifier with high linearity.

BACKGROUND

The demand for multiple carrier aggregation to achieve faster data rates continues to rise as driven by 3GPP technologies. This raises the complexity of the cellular transceiver, such as with triple carrier aggregation, for example, having three corresponding local oscillator (LO) distribution chains. Additionally, the number of bands to be supported and the frequency coverage by a cellular transceiver for mobile communications continues to increase. Each band has its own assigned duplexer band-pass filter with very sharp characteristics. For each duplexer assembled on the printed circuit board (PCB), a corresponding receiver input port is also provided. Thus, the amount of input receiver ports on the integrated transceiver is also steadily increasing. This demands very large chip area/volume, increasing the cost of the chip and complexity of the LO routing for the receivers. Longer LO distribution results in an increase in power consumption by the amplifiers, buffers or amplifiers for buffering the signal. Denser LO lines increase the cross talk between the channels resulting in a large amount of spurious components in the base band, which stem from either continuous-wave or frequency building laws. As more input receiver ports are integrated, the higher power consumption becomes. Thus, there is an increasing desire to reduce the power consumption, which is an important key performance indicator (KPI), as mobile devices (e.g., smartphone, tablet, ultra-book, etc.) are designed to operate as long as possible while supporting phone calls, large data streaming with a maximum time between charging, and more functionality. Efforts are thus being undertaken to design the power consumption of circuits in devices to perform various functions while consuming the minimum amount of battery power. Reducing the power consumption has a further advantage of reducing the amount of heat being generated, which typically can be utilized to reduce efforts for cooling the mobile device or to facilitate further integration and miniaturization of the mobile device.

DETAILED DESCRIPTION

Figure 1:
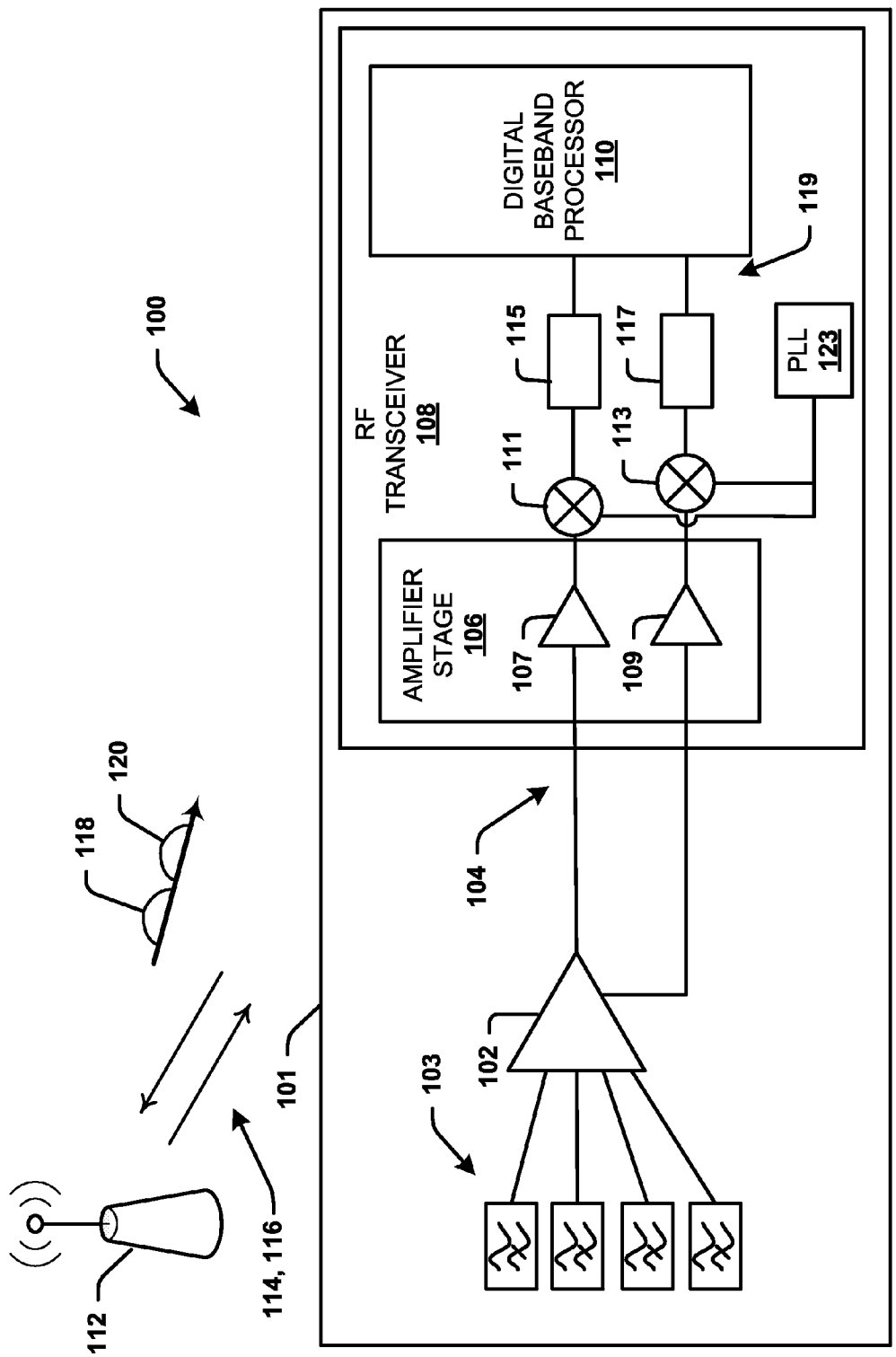
FIG. 1 illustrates a block diagram of a communication environment that utilizes an amplifier component according to various aspects described.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), or firmware. For example, a component can be a processor, a process running on a processor, a controller, an object, an executable, a program, a storage device, a circuit or a computer with a processing device. By way of illustration, an application running on a server and the server can also be a component. One or more components can reside within a process, and a component can be localized on one computer/circuit or distributed between two or more computers/circuit. Additionally, a set of elements or a set of other components can be described herein, in which the term "set" can be interpreted as "one or more."

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies and continued objectives, various aspects for a highly linear push-pull current-reusing common-gate low-noise amplifier with broadband input impedance matching are described. To counteract the trend of an increasing number of receiver ports on an integrated transceiver chip, a low noise amplifier (LNA) that is external to the transceiver chip can operate to reduce the complexity of a communication device, system, circuit board or platform, for example. An external LNA relaxes the noise figure requirements for the input receiver ports of the transceiver, but also increases a demand for greater linearity measures. Another demand for the input ports is a very broadband input matching because the input ports for different carrier bands reside with the external LNA and the output of the external LNA can vary, for example, from 430 MHZ to about 6 GHz or more. The integrated transceiver input ports should be able to operate along the entire frequency range. The solutions described avoid complex passive networks, and comprise a common-gate amplifier that provides a very broadband input impedance matching by offering a low input impedance (e.g., about 1/gm, where gm is the transconductance of an amplifying input transistor).

In one example, a highly linear push-pull current-reusing common-gate low-noise amplifier, which is external to an RF transceiver substrate or chip in a communication device, comprises a PMOS transistor and an NMOS transistor. The transistors are coupled in parallel to one another in a common-gate configuration or topology, in which the gate terminals or control contacts of the amplifier are connected to ground, or a "common" connection and can receive biases for control operations, the drain terminals are the outputs and the source terminals are the inputs. Thus, the gate terminals of each transistor operate as control contacts, the drain terminals of each transistor operate as output contacts and the source terminals of each transistor operate as input contacts. The input signal (e.g., a radio frequency input, broadband input signal, or the like) is applied to an input that is coupled to the source terminals of both transistors, and is received at about the same time, simultaneously or concurrently via a connecting path. The source terminals of each transistor are coupled together by a same path. Further, the drain terminals of both transistors are attached to one another in order to provide a high output resistance to an output stage coupled thereat. In addition, the two transistors (e.g., PMOS and NMOS) share a same path from a DC supply, thus reusing the same current from the supply and reducing power consumption. The two transistors of the push-pull amplifier are further able to provide an amplification gain in sum without increasing a current consumption. In other words, the amplification of both transistors of the amplifier is added (over an NMOS transistor and a PMOS transistor the transconductance is gmn+gmp) without additional current consumption. Additional aspects and details of the disclosure are further described below with reference to figures.

FIG. 1 illustrates a wireless communication environment 100 having a user equipment device 101 that shifts amplification processes of an input signal (e.g., an radio frequency (RF) input) outside an RF transceiver, or transceiver chip in order to further conserve power consumption, chip area, cost of the chip, and reduce complexity of the LO routing. A user equipment or communication device 101 of the wireless communication environment 100, for example, comprises an external input stage having duplexers 103, an external amplifier 102, and an internal input stage as an integrated RF transceiver 108 chip for processing different broadband input signals from different carriers 118, 120. The communication environment 100 comprises a network device 112 and the user equipment device or other communication device 101 that is communicatively coupled to the network device 112 via a downlink port 114 and an uplink port 116 of an air interface, for example.

The RF transceiver 108, for example, comprises an integrated transceiver chip that comprises an amplifier stage having one or more amplifiers 107, 109, such as low noise amplifiers corresponding in number to different types of carrier components, such as carrier components 118, 120. At least two receiver processing chains 119 are independently coupled to the two amplifiers 107 and 109, for example, which amplify signals from the different carrier components 118, 120 along corresponding processing chains. The receiver processing chains 119 each comprise a mixer 111 or 113 for mixing a local oscillator (LO) signal from an LO distribution path of a phase locked loop (PLL) 123, and further provide the mixed signals to a processing component 115 or 117 of each receiver processing chain. The processing component 115 or 117 can further comprise one or more different signal processing components, such as a filter, an analog digital converter, or other components, for example, that couple to a digital baseband processor 110, which can be separate from, partially integrated to or fully integrated to the RF transceiver 108, for example.

The network device 112 represents one or more network devices that operate to generate a coverage area of one or more homogeneous or heterogeneous networks for the communication device 101 or another wireless device that operates to communicate, transmit or receive data, wirelessly with the network device 112 in a broadband frequency for a diversity of carriers 118, 120. The network device 112 can include one or more macro (cell) network devices that broadcast macro network zone coverage areas or one or more micro network devices (e.g., Pico network access point, Metro network access point, Femto network access point, or other similar micro network access points), for example, that are deployed within the wireless communication environment 100 and service one or more communication devices 101 in corresponding network coverage zones. Different wireless communication networks (e.g., macro access points or micro access points) can comprise one or more other network devices such as base stations that operate in conjunction with one another in order to process network traffic (e.g., handoff operations and coverage) for the one or more devices 101. The network devices can be neighbors within one another that overlap or have coverage boundaries alongside or proximate to one another. Macro network devices can comprise a set of network devices that are cellular enabled network devices, which could provide different network speeds (e.g., 2G, 3G, 4G, etc.). In another example, micro access point devices can include a set of network devices that extend network coverage or expand the network environment 100 at the cell edge, especially where access would otherwise be limited or unavailable, and can include any standard such as for example WCDMA, GSM, CDMA2000, TD-SCDMA, WiMAX, LTE, other standards or other solutions. The wireless communication environment 100, other environments, systems or components herein are not limited to any one implementation as depicted by examples, and various other architectures can also be employed. Additional examples also include non-networked devices that are operable within a wireless communication environment.

The communication device or user equipment 101 comprises T/R switches for separating signals in the time domain, or one or more diplexers, or duplexers 103, which separate one or more different received and transmitted signals in a frequency domain and correspond in number to one or more different wideband carrier signals to support wideband communications. An amplifier component 102 can comprise an operational amplifier in any configuration for example, that couples the duplexers 103 to one or more input ports or connections 104. The number of external outputs of the amplifier component 102 can correspond to the number of external carriers. The RF transceiver 108 receives an input signal from the external input processing stage at an amplifier stage 106, and further includes signal processing components 115, 117 integrated thereat. The device 101 can be a transceiver device, a mobile communication device, such as a smart phone, a personal digital assistant, a laptop, or other communication device configured to transmit and receive communications with the network device 112.

In one aspect, the amplifier component 102 comprises an LNA that is external to the RF transceiver 108, and is a current-reusing, common-gate LNA with broadband input matching. The device 101 can comprise different input stages for processing different input signal bands (e.g., radio frequency broadband signals) across a wideband frequency range. The amplifier component 102 can be externally located to, not on the same die, as the RF transceiver 108, in which the amplifier component 102 is part of an external input stage for processing input signals with one or more input ports 104, which correspond to one or more different carriers and can also be external to the RF transceiver 108 to conserve chip volume or space.

The external amplifier component 102 receives input signals via the duplexers 103 depending upon a bandwidth frequency of the input signal, and provides an amplification gain to the input signal. The amplifier component 102 further provides an output impedance for input impedance matching of a broadband input signal along a broadband frequency range with an internal input processing stage or component of the RF transceiver 108.

In one example, the amplifier component 107 or 109 is configured as a push-pull amplifier to facilitate a high linearity in the amplification stage of input processing, and is arranged in a common-gate configuration or topology, in which the gate terminals or control contacts of the amplifier are connected to ground, or a "common" connection and can receive biases for control operations, the drain terminals are the outputs and the source terminals are the inputs. The amplifier component 107 or 109 further includes a push-pull amplifier, either single-ended or differential, that operates as a current-reusing common-gate low-noise amplifier configured to generate a broadband input matching with a subsequent stage. The amplifier component 107 or 109 further accommodates the different carriers and carrier input ports or connections 104 by receiving different carrier signals at one or more operational frequencies along a broad range, such as from 450 MHz to about 6 GHz or greater. The amplifier component 107 or 109 is "current-reusing" because the push stage and pull stage of the push-pull amplifier configuration operate by utilizing a same DC supply path or same current path for both push and pull stages. For each high input signal, while one transistor is fully cut-off, or operating in cut-off, another transistor is fully powered and delivers current, and vice versa in a sequence to provide a high linearity.

The duplexers 103 can comprise connections, for example, to one or more receivers or antennas (not shown) that can correspond to different bandwidths, different operating frequencies, or different networks of various network devices communicating with the device 101 according to the radio resource conditions such as available resources or configurations at the set of input ports 104, devices coupled to signal routes, circuits or components coupled thereto. The input ports 104 can be coupled externally to the RF transceiver 108 in order to conserve volume and reduce complexity thereat. A port can comprise any interconnect or contact for communication of different signals to one or more communication components.

The RF transceiver 108 of the device 101 can operate to communicate with one or more data stores to process or store various communications utilized in carrier aggregation, diversity reception or MIMO channel processing within the communication environment 100. The device 101 can thus utilize various carrier aggregation solutions that can operate to expand the effective bandwidth, for example, or from another effective bandwidth without having multiple carrier ports on the RF transceiver 108. The carrier aggregation concept aggregates multiple component carriers to form a larger overall transmission bandwidth or wideband. In case of intra-band carrier aggregation, the component carriers can fall into the same band with one physical input port, for example. Therefore, there is a need for an efficient separation of component carriers with a broadband input impedance matching, as well as high linearity with a common-gate push-pull amplification stage as the amplifier component 107 or 109, for example.

The two carriers 118 and 120 utilized, for example, in the downlink 114 can be received by the one or more duplexers 103 or receiving component connected to the amplifier component 102 and the RF transceiver 108. Likewise, the same can apply to the uplink 116 and output ports (not shown). The first and second carriers 118 and 120 can, for example, be received via an antenna, a receiving circuit, or other receiving component coupled, which distributes the in-bounding and out-bounding signals to the input ports 104 by way of a selectively generated input impedance matching generated by the push-pull common-gate amplifier of the amplifier component 107 or 109. In case of carrier aggregation, the first carrier 118 can be received and routed via a first signal path/route, wherein the second carrier 120 can be received and routed via a second signal path or distribution chain and amplified by the amplifier component 102.

Further, the device 101 can operate to utilize diversity reception, in which different components can be processed and routed via different antenna ports for processing. In addition, communications can be received by the device 101 from a diversity of network devices. The input ports 104 can thus operate with the amplifier component 107 or 109 as the amplifier stage 106 and duplexer 103 for diversity reception processes, in which one or more input ports are utilized for signals to be received, transmitted, processed, or stored in part based on an antenna port or input port specifications associated with different communications or the criteria discussed above.

Figure 2:
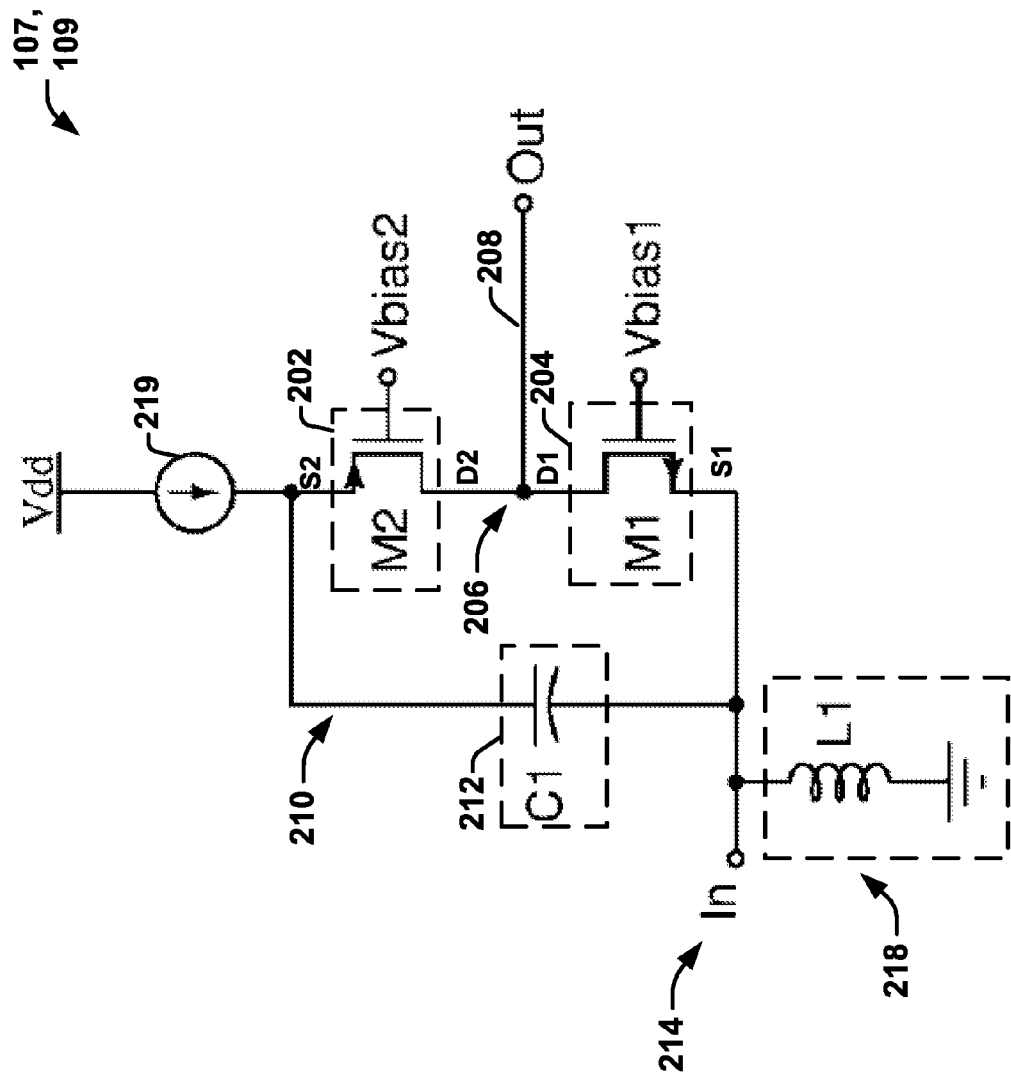
FIG. 2 illustrates an example of an amplifier component according to various aspects described.

Referring to FIG. 2, illustrated is an example configuration of an amplifier component of an amplifier stage in accordance with various aspects. The amplifier stage 106 includes the amplifier components 107, 109 comprising a push-pull amplifier that includes a push amplifier stage 202 and a pull amplifier stage 204 that are coupled to an external amplifier 102 applied to the RF transceiver 108 of FIG. 1.

In one aspect, the push amplifier stage 202 and the pull amplifier stage 204 each include a single FET (e.g., MOSFET) transistor M1 and M2 that are of different transistor or complementary types. The push amplifier stage 202, for example, can include a PMOS transistor M2 and the pull amplifier stage 204 can include an NMOS transistor M1. The transistors M1 and M2 are coupled together in a common-gate configuration, in which the transistors M1 and M2 each comprise an input contact, S1 and S2 respectively, such as a source contact, and an output contact, D1 and D2 respectively, such as a drain contact. The output contacts D1 and D2 (e.g., drain contacts) of the transistors M1 and M2 are coupled together at an output node 206, which further extends to an output terminal 208 of the amplifier stage 106 for providing an output to a subsequent stage of processing, a processing chain or the RF transceiver 108, for example.

The amplifier stage 106 further comprises a conductive path 210 that shorts, or provides, the input signal from both inputs S1 and S2 of each transistor. The conductive path 210 enables the input signal 214 (In), such as a radio frequency input, to be provided to both the input contacts S1 and S2 simultaneously, at the same time or concurrently. The path 210 includes a capacitor component 212 or a capacitor C1, which facilitates providing the same input signal 214 to the input contacts S2 and S1 of both the transistors M2 and M1 at one or more different frequencies. The capacitor C1 enables the path 210 to provide the input signal 214 at a wide operating frequency range to the input contacts S1 and S2 of each amplifier stage 202 and 204 concurrently, or at about the same time, which can also reduce current noise. In one example, the capacitor C1 is sufficiently large enough to provide a short to both source contact S1 and S2 of transistors M1 and M2 for a wideband range of signals.

The transistor M2 of the push stage 202 and the transistor M1 of the pull stage 204 operate together as transconductors arranged in a common-gate configuration. The transistor M2 and transistor M1 are connected at the drain terminal D2 and D1 and at the source terminals S2 and S1 via the path 210 in order to form a parallel configuration, or be connected in parallel with respect to one another. The input impedance of the amplifier component 107 or 109 is broadband matched over a wide range by the parallel connection of the two impedances provided by transistors M2 and M1. The input impedance of the transistors M2 and M1 can be approximately expressed as:

$$1/gmn \| 1/gmp = 1/gmn + 1/gmp.$$

The particular parallel transistor arrangement simplifies achieving a broadband input matching to a connected line or load impedance, such as of 50Ω or 100Ω single-ended, for example.

In addition, the amplifier component 102 can be biased by a DC path that is external to the RF transceiver 108 in order to further save footroom, or control the level of saturation, and enhance linearity of the output. In another aspect, the transistor M2 of the push stage 202 and the transistor M1 of the pull stage 204 share the same DC current path (e.g., flowing through a supply voltage, both transistors M2 and M1 to ground), and thus are also arranged as a current-reusing push-pull amplifier. A current supply Vdd provides current to the input contact S2 (e.g., source terminal) of the transistor M2, which can flow through both transistors M2 and M1 to ground at the bias component 218, for example. Both transistors share the same path from Vdd, the current source or current bias component 219, transistor M2, transistor M1 to the inductor L1 and to Vss and thus reuse this same current path, thus reducing power consumption.

The amplifier component 107 or 109 further operates to generate an amplification gain of the input with both transistors M2 and M1. The amplification gain can be generated as a sum of the push stage 202 and the pull stage 204 without causing an additional current consumption by the amplifier 107, 109, from either stage independently or an operation of the amplifier stage 106 overall. The amplification of both transistors M2 and M1 can be added, in which overall transconductance is expressed as gmn+gmp, without additional current consumption.

The amplifier stage 106 operates, for example, as a transconductor or a gm-cell, in which the transistors M2 and M1 receive an input voltage and drive an output current in response to a loading input impedance of a subsequent stage (e.g., transceiver/baseband processor or other transceiver component/device). Additionally or alternatively, in response to the following stage (subsequent connected component, line, distribution chain, load, etc.) being high, the output signal generated at the output terminal 208 is a voltage in one example. A high output resistance overall is achieved by the drains D2 and D1 of the transistors M2 and M1 being connected in parallel to one another, which further facilitates a high amplification gain at the output.

The overall voltage amplification of the amplifier 107 or 109 can be approximated as: (gmn+gmp)·(ZLoad∥rds1∥rds2), where gmn and gmp are transconductances of M1 and M2 respectively, rds1 and rds2 are output resistances of M1 and M2 respectively, and ZLoad is the input impedance of a following stage coupled at the output terminal 208.

The input impedance can also be determined by 1/(gmn+gmp). Thus, to match a 50Ω line or subsequent stage, transconductances of both transistors could be equal (e.g., gmn=gmp=10 mS). This can be advantageous because only half of the total transconductance gm of the amplifier component 107 or 109 could be utilized in the case of a single-ended single-transistor common-gate stage, in which, for example, 1/gmn=50Ω→gmn=20 mS. A lower required gm results also in lower required DC current to achieve matching.

In another aspect, to further enhance linearity of the amplifier components 107 or 109, a bias component 218 can facilitate or further provide a DC bias through a large inductor L1, which can be integrated either on a same printed circuit board (PCB) or on-chip as the RF transceiver 108, or externally such as with the amplifier component 102. For example, the inductor L1 can be an external surface mount device (SMD) component to save chip area, which can be expensive in advanced CMOS technologies. The inductor L1 is configured to provide a bias to the amplifier component and to resonate out the input capacitance of the input (In) 214.

Figure 3:
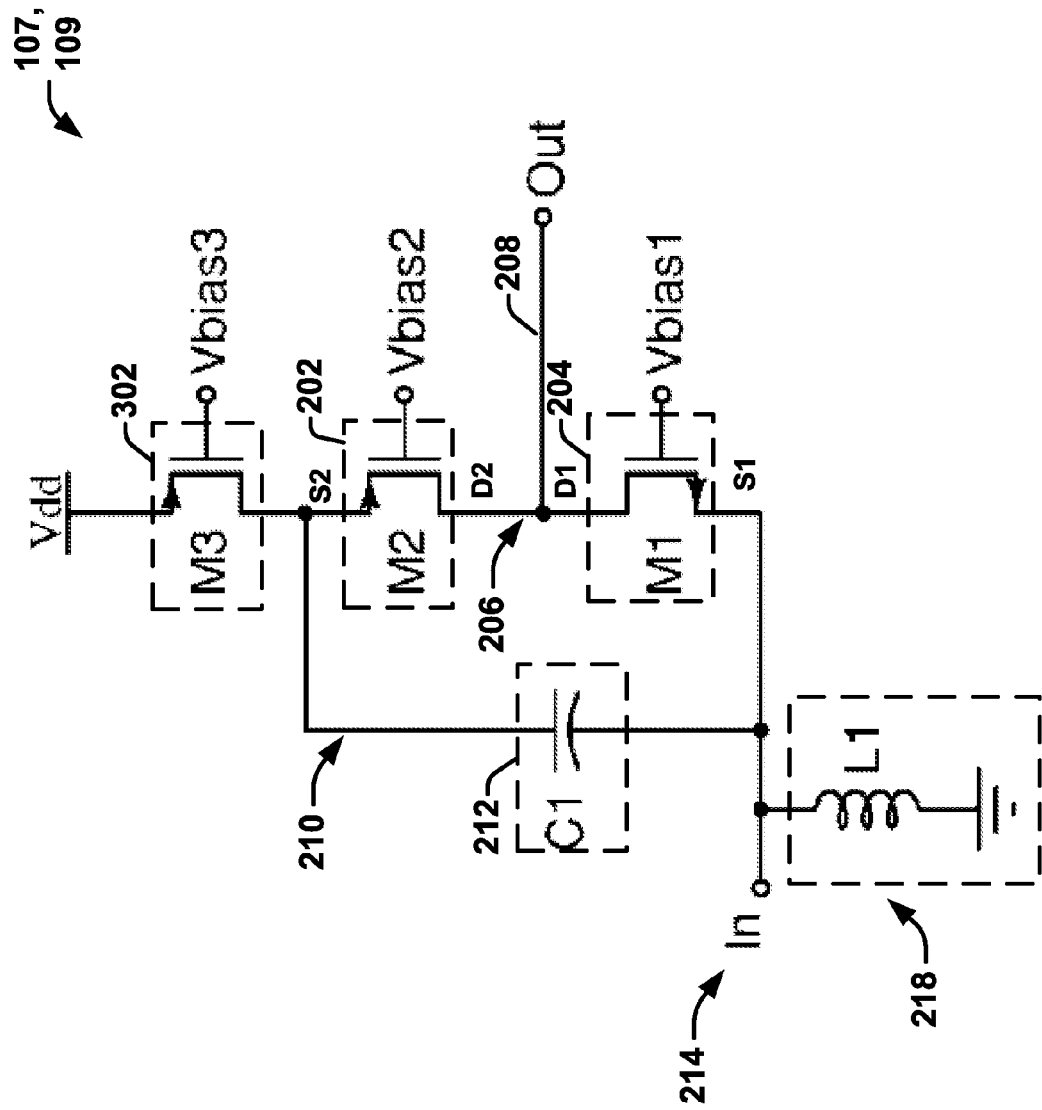
FIG. 3 illustrates another example of an amplifier component according to various aspects described.

Referring to FIG. 3, illustrated is another example of an amplification component for a communication system in accordance with various aspects. In one aspect, different architectures can provide a bias current for the transistors M2 and M1 of the amplifier component 107 or 109. For example, a transistor component M3 302 can operate to provide a bias with at least one transistor, such as a PMOS transistor that is configured as a current source for the amplifier component 107 or 109 from a Vdd supply rail. This solution together with the highly linear push-pull current-reusing common gate low noise amplifier configuration of the amplifier component 107 or 109 discussed above can consume the least headroom or power capability as opposed to a resistor or a diode-connected transistor, for example. In one advantage, a linearity for third order intercept point (IIP3) of 6 dBm or greater can be achieved.

Figure 4:
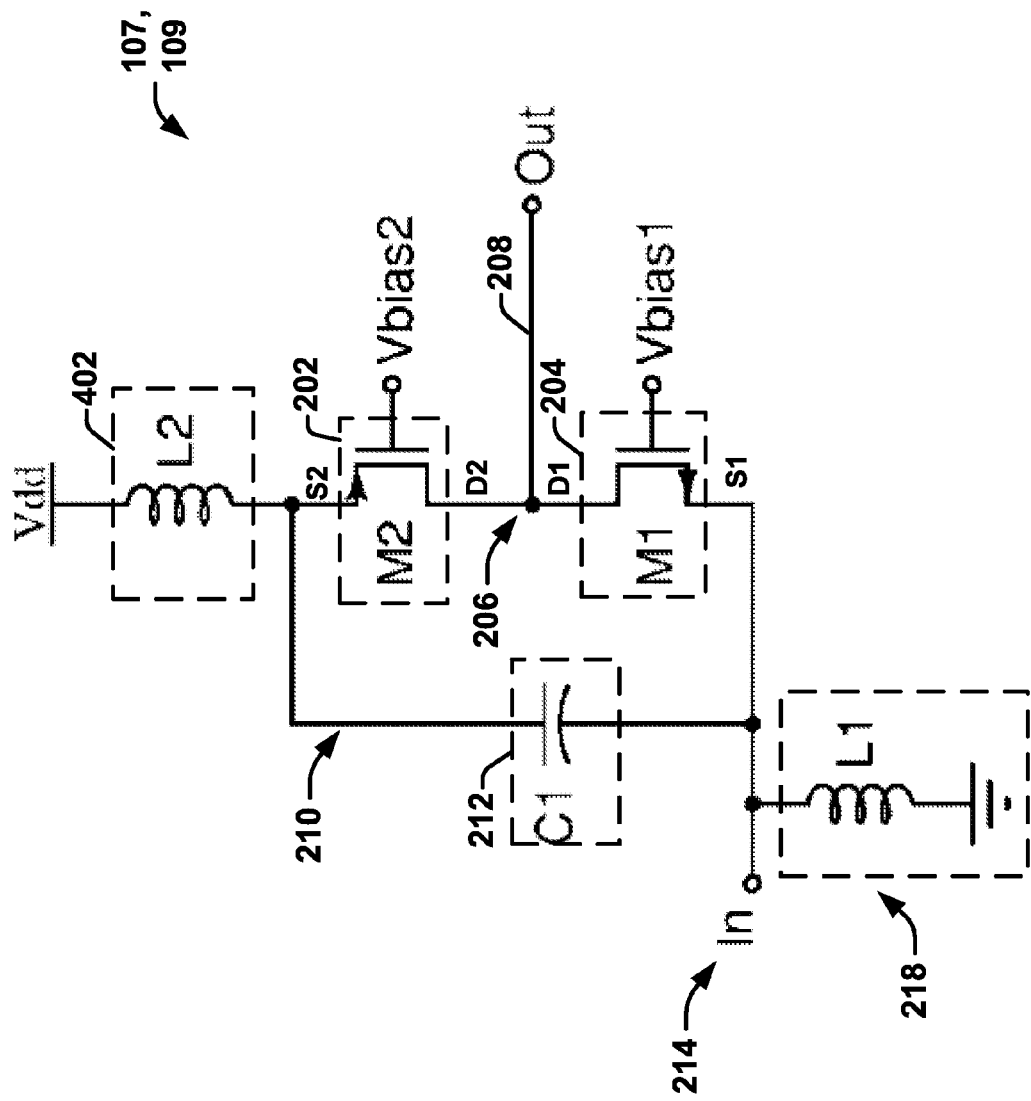
FIG. 4 illustrates another example of an amplifier component according to various aspects described.

Referring to FIG. 4, illustrated is another example of an amplification component for a communication system in accordance with various aspects. Another example of an architecture of the amplifier component 107 or 109 is illustrated that provides a bias from a Vdd rail via an inductor component 402 with at least one inductor L2 connected to the input contact S2. The inductor L2 can operate to further enhance the linearity of the amplifier component 107 or 109. For example, a linearity for third order intercept point (IIP3) of greater than 6 dBm can be achieved.

Figure 5:
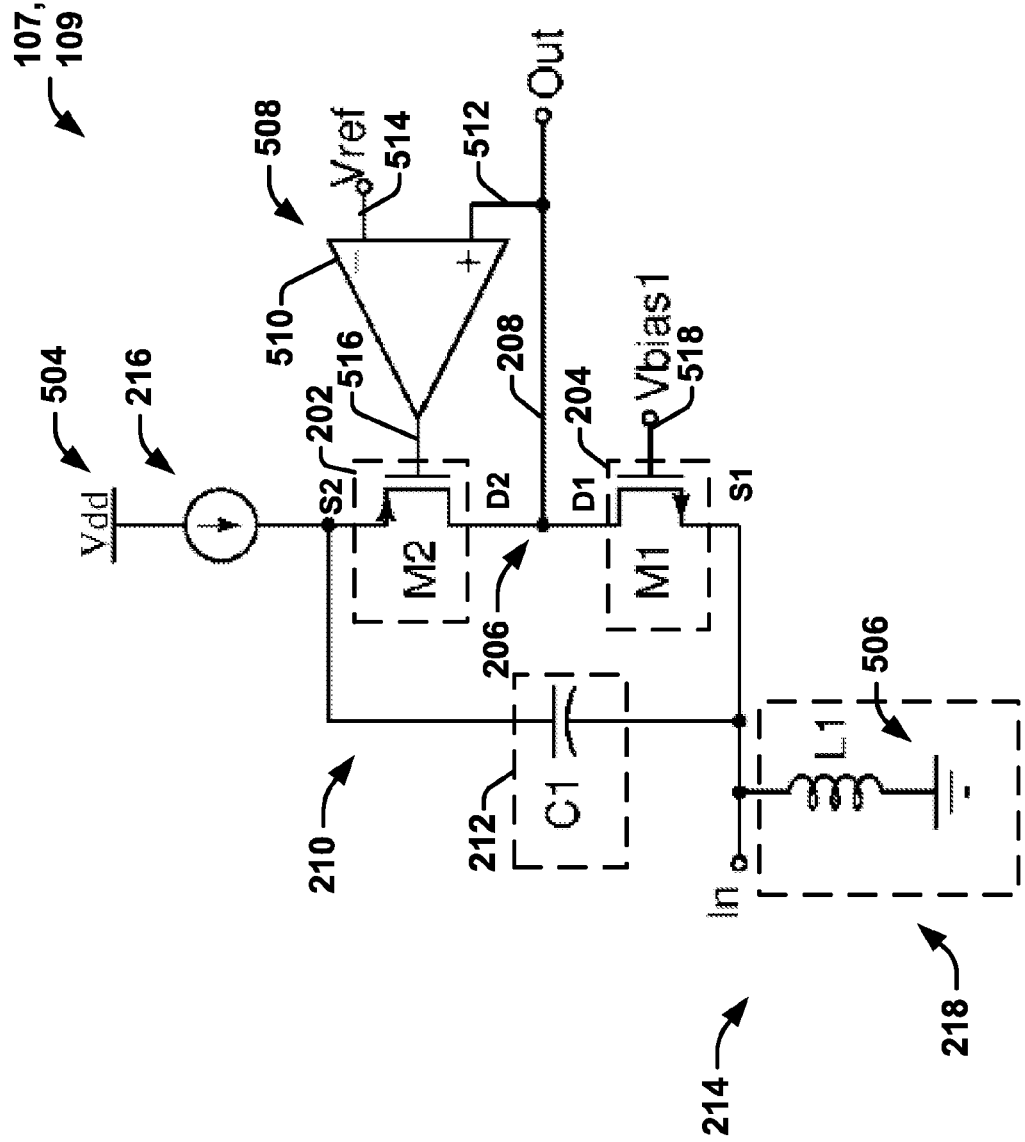
FIG. 5 illustrates another example of an amplifier component according to various aspects described.

Referring to FIG. 5, illustrated is another example configuration of an amplifier component in accordance with various aspects being described. The architecture of the amplifier component 107 or 109 is similar to the structure described in FIG. 2 above with only one inductor or bias component 218 (e.g., L1) being connected at a node or junction within the push-pull amplifier circuit, which can be an external inductor or an internal inductor relative to the transceiver or baseband processor chip 108.

In one aspect, the amplifier component 107 or 109 (e.g., a push-pull amplifier) comprises the first output contact D2 or drain terminal of the transistor M2 that is coupled at the output node 206 and a second different output contact D1 of transistor M1, also coupled to the output node 206 and the first output contact D2. The output node 206 is located between a first supply rail 504 (e.g., a Vdd) having a first supply level and a second supply rail 506 (e.g., ground or other supply level) having a second supply level that is different from the first supply level. The output node 206 can have an output node voltage that is approximately at a middle level, or center voltage, between the first supply rail 504 having the first supply level and the second supply rail 506 having a second supply level different from the first supply level. For example, the output node 206 can be biased at Vdd/2. As such, FIG. 5 illustrates an example of a biasing scheme for implementing the amplifier component 107 or 109 where the output potential at the output terminal 208 is located in the middle between the supply rail levels (Vdd and Vss), which can also enhance the linearity and allow a maximal possible voltage swing.

In another aspect, the amplifier component 107 or 109 comprises a feedback path 508 that is coupled between the output terminal 208 and a first control contact (e.g., a gate terminal) of the first transistor M2. The control contact 516 of M2 is thus configured to receive a bias that is a function of the output at the output terminal 208 and a reference voltage. The feedback path 508 can comprise a common-mode feedback loop. For example, the feedback path 508 can comprise an amplifier 510, such as an operational amplifier or a common-mode feedback amplifier (CMFB) 510 with a first input 512 coupled to the output terminal 208, and a second input 514 that is coupled to a reference voltage Vref, such that the bias received at the control contact 516 is a function of a comparison of an output signal at the output 208 and Vref. An output of the amplifier 510 feeds into the gate terminal 516 of the transistor M2. The CMFB 510 operates to sense a difference of DC levels between an output node 206 and a Vref node 514, amplifies the difference and sets the level at output 516 in a closed loop. This closed loop regulates the voltage until the difference is zero, in which the DC level at the output 516 is approximately equal to Vref.

Biasing of the transistor M2 via the feedback path 508 can be achieved by means of the CMFB amplifier 510, for example, which is attached at the output terminal 208 with one input and with the other input to a reference voltage generated from a bandgap voltage. The output of the CMFB amplifier is fed to the gate of the transistor M2. The CMFB amplifier 510 regulates the level such that the DC voltage at the output is controlled to be approximately equal to the reference voltage Vref at the CMFB, Vout=Vref, which facilitates a stable biasing. In response to a variation between Vout and Vref, a modification of the bias or control signal to the output contact 516 is generated. The transistor M1, likewise, can receive a separate bias Vbias1 at the gate control terminal 518 from a different mechanism, as a different bias level, for example, or be the same as Vref or the control bias to transistor M2.

Figure 6:
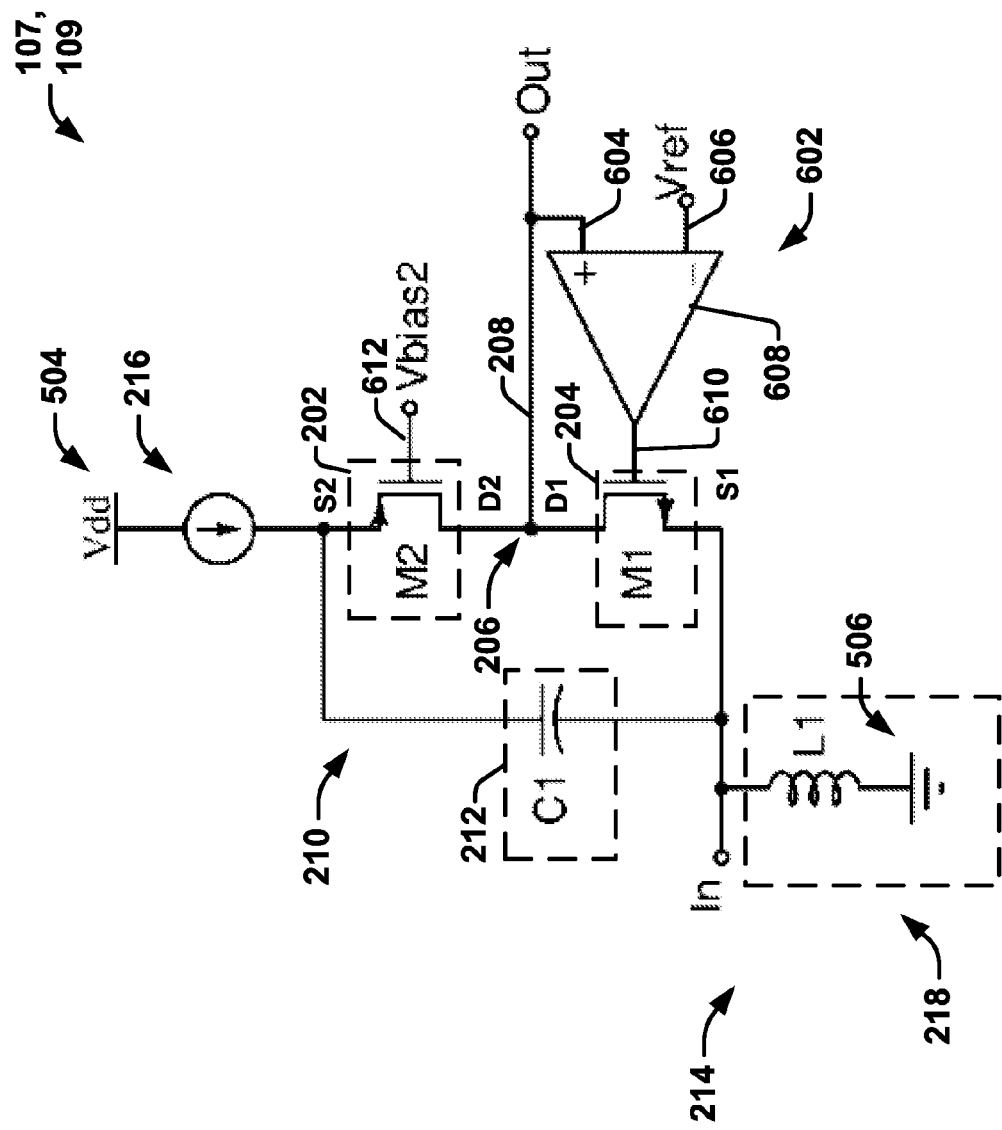
FIG. 6 illustrates another example of an amplifier component according to various aspects described.

Referring to FIG. 6, illustrated is another example of the amplifier component. The amplifier component 107' of FIG. 6 comprises similar elements/components as FIG. 5. However, a feedback path 602 operates to provide a control signal (e.g., a control voltage or current) to the transistor M1 of a pull stage 204. The feedback path 602 is coupled to a control input (e.g., a gate terminal) 610 of the transistor M1 and to the output terminal 208.

For example, the feedback path 602 can comprise an amplifier 608, such as a common-mode feedback amplifier (CMFB) having a first input 604 that is coupled to the output terminal 208 and a second input 606 that is coupled to a reference voltage Vref. An output of the amplifier 608 feeds a bias to the control contact 610 (e.g., to a gate terminal) of the transistor M2. The CMFB amplifier 608, for example, can be configured facilitate a bias level of the output signal that is approximately at a middle level between the first supply rail (Vdd) 504 having a first supply level and the second supply rail (Vss), such as ground 506 or other potential, having a second supply level that is different from the first supply level. The CMFB amplifier 608 regulates the level of the output at output terminal 208 such that the DC voltage at the output is approximately equal to the reference voltage Vref at the CMFB 608, Vout=Vref, which facilitates a stable biasing, in a similar process as the configuration discussed above with regard to FIG. 5. The transistor M2 of the push stage 202, likewise, can receive a separate bias Vbias1 at the control contact 610 from a different mechanism, as a different bias level, for example, or be the same as Vref or the control bias to transistor M1.

Figure 7:
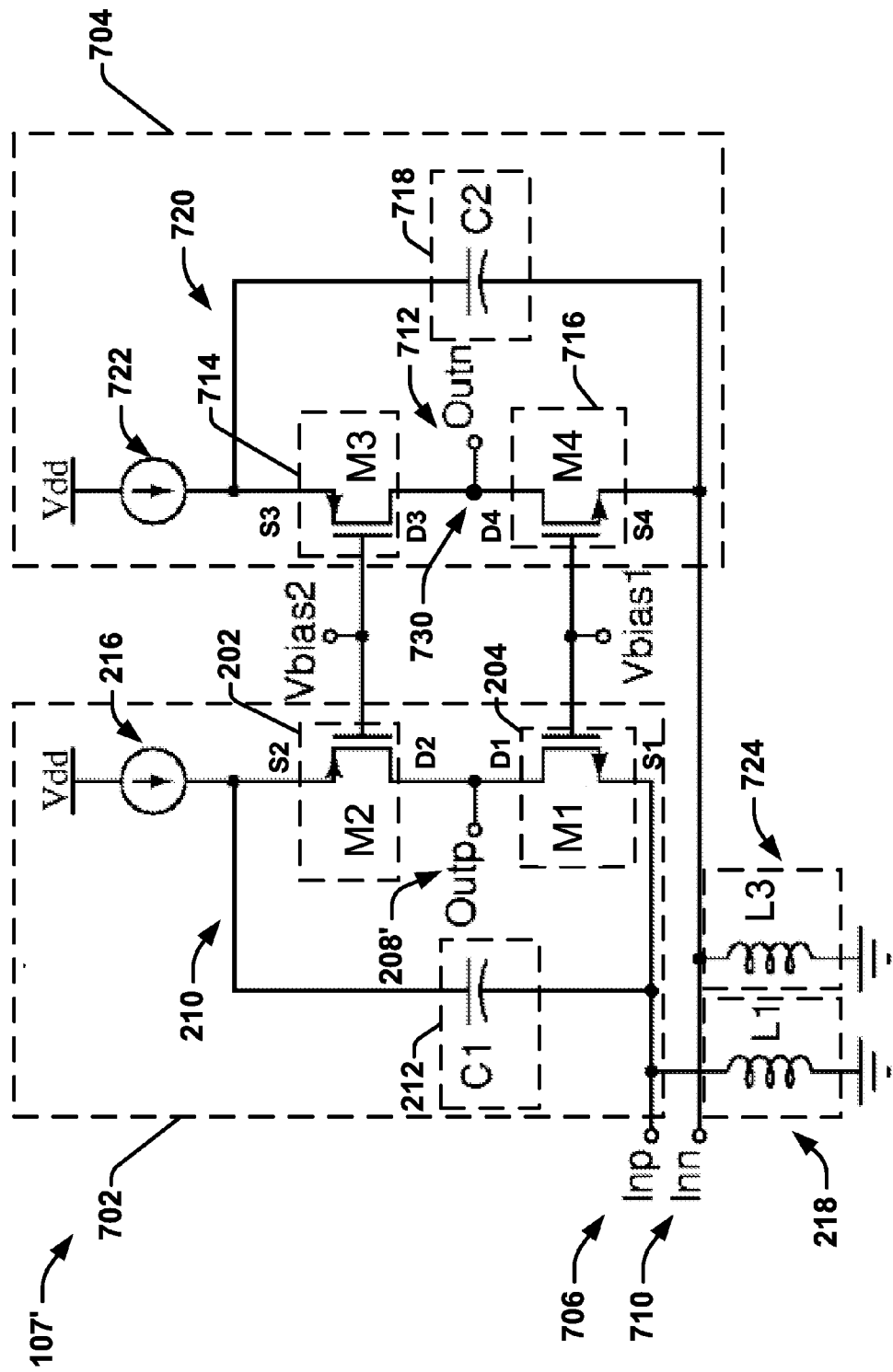
FIG. 7 illustrates another example of an amplifier component according to various aspects described.

Referring to FIG. 7, illustrated is an example amplifier component according to various aspects. The amplifier component 107' of FIG. 7 is similar to the amplifier component 107 discussed above, further illustrating a differential configuration of two push-pull amplifiers 702 and 704 that can operate differentially, for example.

The differential amplifier 107' comprises a first push-pull amplifier 702 and a second push-pull amplifier 704, in which each push-pull amplifier 702 and 704 forms a single-ended push-pull amplifier. The first single-ended push-pull amplifier 702 is arranged between a p-input 706 and a p-output 208', wherein the second single-ended push-pull amplifier 704 is arranged between an n-input 710 and an n-output 712, such that the p-input 706 and the n-input 710 form a differential input of the differential push-pull amplifier 107' and the p-output 708 and the n-output 712 form a differential output of the differential push-pull amplifier 107'.

The push-pull amplifier 702 and the push-pull amplifier 704 each comprise similar elements as discussed above in FIG. 2. The push-pull amplifier 704 comprises a push amplifier stage 714 and a pull amplifier stage 716. The push amplifier stage 714 comprises a single transistor M3, such as a FET or MOSFET transistor, connected in parallel to the pull amplifier stage 716. An output contact D3 (e.g. a drain contact) of the transistor M3 is connected to an output contact D4 (e.g. a drain contact) of a transistor M4 of the push amplifier stage 716 via a common node 730. When one transistor is fully powered on, another transistor can be fully powered off, or operate in cut-off in a sequential pattern. In addition, an input contact S3 (e.g., a source contact) of the transistor M3 is also coupled to the input contact S4 of the transistor M4 via a conductive path 720. The path 720 can include one or more components such as a capacitor component 718 having a capacitor C2, which facilitates providing the same input signal to the input contacts S3 and S4 of both the transistors M3 and M4. The capacitor C2, similarly to the capacitor C1 for the push-pull amplifier 702, enables the path 720 to provide the input signal 214 to the input contacts of each amplifier stage 714 and 716 concurrently, or at about the same time, at an operating frequency or operating frequency range.

The push amplifier stage 714 differs from the pull amplifier stage 716 regarding its transistor type. So, the push amplifier stage 714 can comprise a transistor of a first transistor type, e.g. PMOS transistor type, while the pull amplifier stage 716 can comprise a transistor of a second transistor type complementary to the first transistor type, e.g. an NMOS transistor type. The transistor M3 of the push stage 714 and the transistor M4 of the pull stage 716 also operate together as transconductors arranged in a common-gate configuration.

The push-pull amplifier 704 can be biased by a DC path that is external to a baseband processor or the RF transceiver 108 in order to further save footroom, or control the level of saturation, and enhance linearity. In another aspect, the transistor M2 of the push stage 202 and the transistor M1 of the pull stage 204 share the same current path and are arranged as a current-reusing push-pull amplifier. A current supply 722 provides current to the input contact S3 (e.g., source terminal) of the transistor M3. Additionally, both transistors share the same input path 720 from the supply 722. The transistors M3 and M4 therefore operate by reusing the same current from the supply 722 and further reduce power consumption.

The push-pull amplifier 704 further operates to generate an amplification gain of the input with both transistors M3 and M4. The amplification gain can be generated as a sum of the push stage 714 and the push stage 716 without causing an additional current consumption. The amplification of both transistors M3 and M4 can be added, in which over transconductance is expressed as gmn+gmp for each transistor stage, without additional current consumption.

In another aspect, to further enhance linearity, a bias component 724 can facilitate a DC bias provided through a large inductor L3, which can be integrated either on a same printed circuit board or on-chip as the RF transceiver 108. The inductor L3 is configured to provide a bias to the amplifier component and to resonate out the input capacitance of the input (In) 710. The output terminals 208' and 712 are thus able to operate as a differential output together in response to only one inductor component or inductor L1 or L3 being coupled to each push-pull amplifier 702, 704, which receives an input voltage and drives an output current or output voltage depending upon the impedance of a subsequent stage coupled thereat.

An advantage of the differential current-reusing, common-gate, push-pull low noise amplifier 107' is that the differential signaling response for RF circuits, for example, can provide improved noise, improved dynamic range, better spurious response, common-mode noise rejection (e.g., nose at the supply line), double signal swing and inherently lower even-order harmonics. Thus, for a linear driven application, a differential implementation can be envisioned for a higher second order intercept point (IIP2), which could be dominated by mismatches among components.

Figure 8:
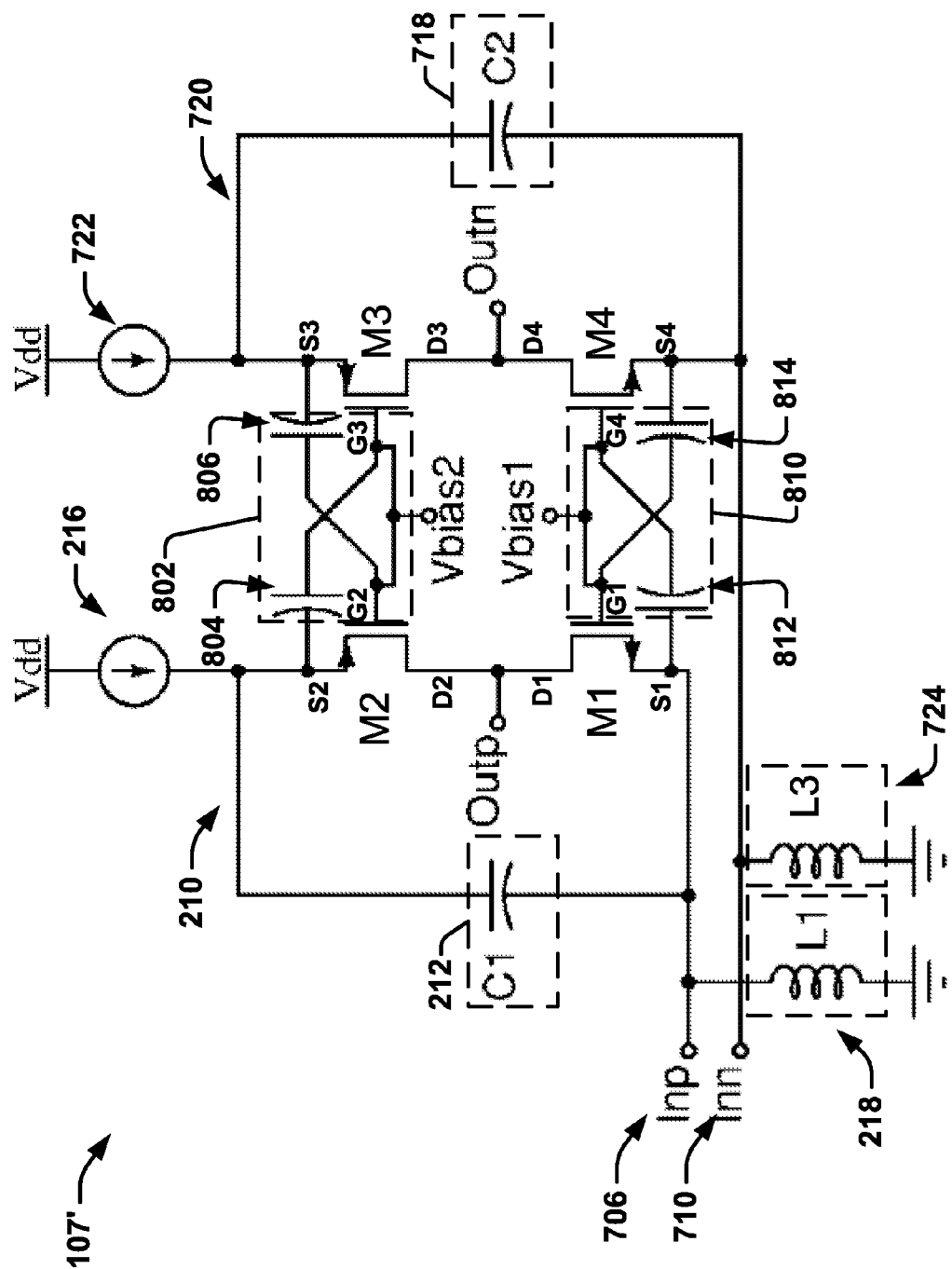
FIG. 8 illustrates another example of an amplifier component according to various aspects described.

Referring to FIG. 8, illustrated is another example of a differential amplifier component that increases the transconductance (gm) by means of a capacitive cross coupling component in accordance with various aspects. The capacitive cross coupling enables gain boosting that further increases the amplification of the output of the push-pull amplifier 107' without a change in DC current consumption.

The transistors M2 and M3, for example, are coupled together via a first cross coupling component 802, while the transistors M1 and M4 are coupled together via a second cross coupling component 810. The cross-coupling component 802 is configured to cross-couple a first capacitor 804 between an input contact S2 of the transistor M2 (e.g., of the push-pull amplifier 702 of FIG. 7) and a control contact G3 (e.g., a gain contact) of the transistor M3 (e.g., of the second push-pull amplifier 704 of FIG. 7). The cross-capacitor component 802 also cross-couples a second capacitor 806 between the input contact S3 of the transistor M3 and a corresponding control contact G2 of transistor M2. A second cross-coupling component 810 is configured to cross-couple a third capacitor 812 between the input contact S1 of the transistor M1 and a control contact G4 of the transistor M4. The second cross-coupling component 810 further cross-couples a fourth capacitor 814 between the input contact S4 of the transistor M4 and a control contact G1 of the transistor M1.

Figure 9:
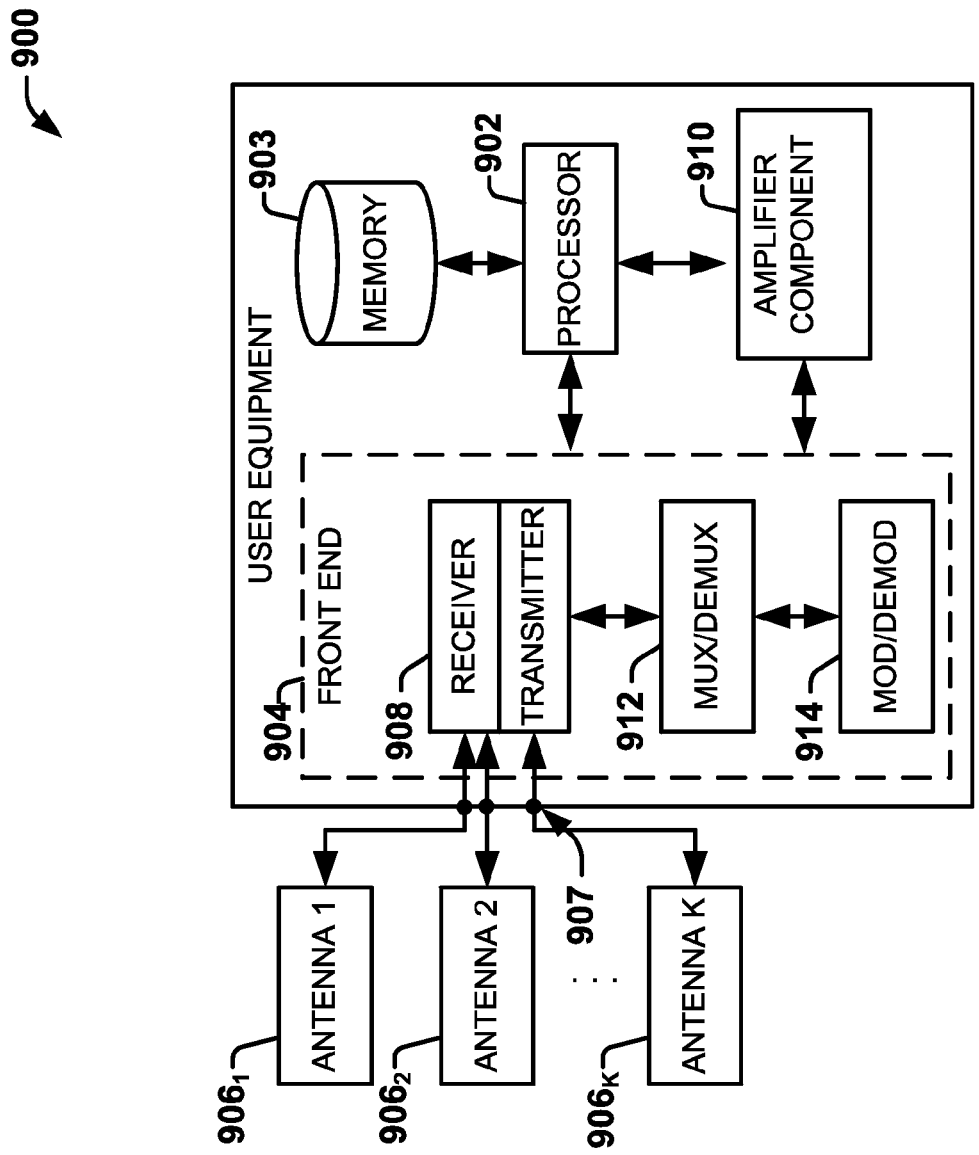
FIG. 9 illustrates an example mobile communication device having a converter system in accordance with various aspects described.

To provide further context for various aspects of the disclosed subject matter, FIG. 9 illustrates a block diagram of an embodiment of access equipment, user equipment (e.g., a mobile device, communication device, personal digital assistant, etc.) or software 900 related to access of a network (e.g., base station, wireless access point, femtocell access point, and so forth) that can enable and/or exploit features or aspects of the disclosed aspects.

The user equipment or mobile communication device 900 can be utilized with one or more aspects of the converter systems or devices described according to various aspects herein. The mobile communication device 900, for example, comprises a digital baseband processor 902 that can be coupled to a data store or memory 903, a front end 904 (e.g., an RF front end, an acoustic front end, or the other like front end) and a plurality of antenna ports 907 for connecting to a plurality of antennas $906_1$ to $906_k$ (k being a positive integer). The antennas $906_1$ to $906_k$ can receive and transmit signals to and from one or more wireless devices such as access points, access terminals, wireless ports, routers and so forth, which can operate within a radio access network or other communication network generated via a network device (not shown). The user equipment 900 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 904 can include a communication platform, which comprises electronic components and associated circuitry that provide for processing, manipulation or shaping of the received or transmitted signals via one or more receivers or transmitters 908, a mux/demux component 912, and a mod/demod component 914. The front end 904, for example, is coupled to the digital baseband processor 902 and the set of antenna ports 907, in which the set of antennas $906_1$ to $906_k$ can be part of the front end. In one aspect, the mobile communication device 900 can comprise an amplifier component 910 configured as a current-reuse push-pull common-gate low-noise amplifier with broadband input matching capability that operates according to the functions and architectures disclosed herein, such as amplifier component 107 or the differential amplifier component 107'.

The user equipment device 900 can also include a processor 902 or a controller that can operate to provide or control one or more components of the mobile device 900. For example, the processor 902 can confer functionality, at least in part, to substantially any electronic component within the mobile communication device 900, in accordance with aspects of the disclosure. As an example, the processor can be configured to execute, at least in part, executable instructions that control various modes of the amplifier 910 as a multi-mode operation for input signals at the antenna ports 907, an input terminal or other terminal based on one or more characteristics of the amplifier component 910.

The processor 902 can operate to enable the mobile communication device 900 to process data (e.g., symbols, bits, or chips) for multiplexing/demultiplexing with the mux/demux component 912, or modulation/demodulation via the mod/demod component 914, such as implementing direct and inverse fast Fourier transforms, selection of modulation rates, selection of data packet formats, inter-packet times, etc. Memory 903 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

The processor 902 is functionally and/or communicatively coupled (e.g., through a memory bus) to memory 903 in order to store or retrieve information necessary to operate and confer functionality, at least in part, to communication platform or front end 904, and the amplifier component 910, which represents any amplifier component or amplifier architecture according to various aspects discussed herein.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is an amplifier that comprises an input terminal configured to receive an input signal, and an output terminal configured to drive an output signal. A first transistor comprises a first input contact coupled to the input terminal and a first output contact coupled to the output terminal. A second transistor includes a second input contact coupled to the input terminal and a second output contact coupled to the first output contact of the first transistor and the output terminal. A current bias component, coupled to the first input contact of the first transistor, is configured to provide a bias current to the first transistor and the second transistor along a same current path. A capacitor component, coupled between the first input contact of the first transistor and the second input contact of the second transistor, is configured to short the input signal between the first input contact and the second input contact at an operating frequency range and provide the input signal to the first input contact and the second input contact.

Example 2 includes the subject matter of Example 1, further comprising an inductor component coupled to the input terminal and configured to provide a DC path for the bias current.

Example 3 includes the subject matter of any of Examples 1 and 2, including or omitting optional elements, wherein the current bias component comprises a third transistor, an integrated resistor or an integrated inductor configured as a current source to provide the bias current to the first transistor and the second transistor along the same current path.

Example 4 includes the subject matter of any of Examples 1-3, including or omitting optional elements, wherein the output terminal is coupled at an output node located between the first output contact and the second output contact with a voltage potential between a first supply level and a second supply level that is different from the first supply level.

Example 5 includes the subject matter of any of Examples 1-4, including or omitting optional elements, further comprising a feedback path coupled between the output terminal and a first control contact of the first transistor, or coupled between the output terminal and a second control contact of the second transistor, wherein the feedback path is configured to control a first bias to the first transistor or a second bias to the second transistor, respectively, based on a reference voltage, wherein the first control contact is configured to receive the first bias, and the second control contact is configured to receive the second bias that is different from the first bias.

Example 6 includes the subject matter of any of Examples 1-5, including or omitting optional elements, wherein the feedback path comprises a common-mode feedback amplifier comprising a first input coupled to the output terminal; a second input coupled to the reference voltage; and an output coupled to the first control contact or the second control contact, wherein the first control contact and the second control contact comprise gate contacts of the first transistor and the second transistor, respectively.

Example 7 includes the subject matter of any of Examples 1-6, including or omitting optional elements, wherein the first transistor and the second transistor are configured to both amplify the input signal and reuse a current along the same current path.

Example 8 includes the subject matter of any of Examples 1-7, including or omitting optional elements, wherein the first input contact and the second input contact comprise source contacts of the first transistor and the second transistor, and the first output contact and the second output contact comprise drain contacts, and wherein the first transistor and the second transistor comprise FET transistors of different PMOS and NMOS transistor types respectively.

Example 9 includes the subject matter of any of Examples 1-8, including or omitting optional elements, wherein the first transistor and the second transistor are coupled together in a common gate configuration as a current-reusing common-gate low-noise amplifier configured to vary an input impedance.

Example 10 is a communication system comprising an input component configured to receive or transmit one or more input signals. The communication system comprises a baseband processor integrated on a single substrate configured to process the one or more input signals; and a amplifier arranged in a common-gate configuration configured to match an input impedance of the one or more input signals. The amplifier comprises an amplifier input terminal configured to receive the one or more input signals; an amplifier output terminal configured to provide an output signal having a gain based on the one or more input signals; a push stage comprising a first transistor of a first transistor type coupled to a current supply via a current path; a pull stage comprising a second transistor of a second transistor type coupled to the push stage and to the current supply via the current path; and a capacitor component, coupled between input contacts of the first transistor and the second transistor, configured to provide the one or more input signals at an operating frequency range to the push stage and the pull stage.

Example 11 includes the subject matter of Example 10, wherein the first transistor comprises a first source contact coupled, via the capacitor component, to the amplifier input terminal and a second source contact of the second transistor; and a first drain contact coupled, via an output node, to a second drain contact of the second transistor; wherein the amplifier is configured to provide the output signal at the amplifier output terminal via the output node with the gain that is based on a sum of a transconductance of the first transistor and the second transistor independent of a current consumption of the amplifier.

Example 12 includes the subject matter of any of Examples 10-11, including or omitting optional elements, wherein the pull stage and the push stage are coupled to one another in a parallel configuration and configured to detect the one or more input signals concurrently.

Example 13 includes the subject matter of any of Examples 10-12, including or omitting optional elements, wherein the amplifier is located externally to the single substrate and further comprises: a feedback path coupled between the amplifier output terminal and a first gate contact of the first transistor or a second gate contact of the second transistor, wherein the feedback path is configured to control a first bias to the first transistor or a second bias to the second transistor based on a reference voltage.

Example 14 includes the subject matter of any of Examples 10-13, including or omitting optional elements, wherein the feedback path comprises a common-mode feedback (CMFB) amplifier coupled to the amplifier output terminal at a first CMFB input, a reference voltage at a second CMFB input and a gate contact of the first transistor or the second transistor at a CMFB output.

Example 15 includes the subject matter of any of Examples 10-14, including or omitting optional elements, wherein the CMFB amplifier is configured to generate a bias level of the output signal that is approximately at a middle level between a first supply level and a second supply level that is different from the first supply level.

Example 16 includes the subject matter of any of Examples 10-15, including or omitting optional elements, wherein the first gate contact of the first transistor receives a different voltage bias than the second gate contact of the second transistor.

Example 17 includes the subject matter of any of Examples 10-16, including or omitting optional elements, further comprises an inductor coupled to the amplifier input terminal configured to bias the received one or more input signals.

Example 18 is a mobile communication device comprising a transceiver component comprising at least one differential amplifier. The transceiver component comprises a differential input having a p-input and an n-input; a differential output having an n-output and a p-output; and a first amplifier arranged between the p-input and the n-output and a second amplifier arranged between the n-input and the p-output. The first amplifier and the second amplifier are in a common-gate configuration and respectively comprise: an amplifier input connected to the p-input or to the n-input; a push stage comprising a first transistor of a PMOS type that is coupled to a current bias; a pull stage comprising a second transistor of an NMOS type coupled in parallel to the push stage in a common gate configuration and to a current supply via a same current input path as the first transistor; and a capacitor component including at least one capacitor, coupled between input contacts of the first transistor and the second transistor, configured to concurrently provide one or more input signals at an operating frequency range to the push stage and the pull stage.

Example 19 includes the subject matter of Example 18, further comprising: a first cross-coupling component configured to cross-couple a first capacitor between a first input contact of the first transistor of the first amplifier and a first control contact of the first transistor of the second amplifier, and cross-couple a second capacitor between a first input contact of the first transistor of the second amplifier and a first control contact of the first transistor of the first amplifier; and a second cross-coupling component configured to cross-couple a third capacitor between a second input contact of the second transistor of the first amplifier and a second control contact of the second transistor of the second amplifier, and cross-couple a fourth capacitor between a second input contact of the second transistor of the second amplifier and a second control contact of the second transistor of the first amplifier.

Example 20 includes the subject matter of any of Examples 18-19, including or omitting optional elements, wherein the n-input and the p-input respectively comprise a biasing component that includes an inductor configured to provide a DC bias to the same current input path.

Example 21 is a method for a amplifier comprising receiving one or more input signals via a communication device; processing the one or more input signals via a amplifier arranged in a common-gate configuration; generating a first output signal having a gain via a first transistor of a push stage of the amplifier and a current supply of a current path; and generating a second output signal having the gain via a second transistor of a pull stage of the amplifier and the current supply of the current path. The receiving comprises concurrently receiving the one or more input signals at an operating frequency range to the push stage and the pull stage of the amplifier via a capacitor component coupled to a first input of the first transistor and a second input of the second transistor.

Example 22 includes the subject matter of any of Example 21, wherein the amplifier is configured to provide the output signal at the amplifier output terminal via the output node with the gain that is based on a sum of a transconductance of both the first transistor and the second transistor without increasing a current consumption of the amplifier Applications (e.g., program modules) can include routines, programs, components, data structures, etc., that perform particular tasks or implement particular abstract data types. Moreover, those skilled in the art will appreciate that the operations disclosed can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated mobile or personal computing devices.

A computing or processor device, such as devices disclosed herein or can typically include a variety of computer-readable media. Computer readable media can be any available media that can be accessed by the computer and includes both volatile and non-volatile media, removable and non-removable media. By way of example and not limitation, computer-readable media can comprise computer storage media and communication media. Computer storage media includes both volatile and non-volatile, removable and non-removable media implemented in any method or technology for storage of information such as computer-readable instructions, data structures, program modules or other data. Computer storage media (e.g., one or more data stores) can include, but is not limited to, RAM, ROM, EEPROM, flash memory or other memory technology, CD ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may comprise one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), CDMA2000, etc. UTRA includes Wideband-CDMA (W-CDMA) and other variants of CDMA. Further, CDMA2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical discs (e.g., compact disc (CD), digital versatile disc (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product may include a computer readable medium having one or more instructions or codes operable to cause a computer to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

What is claimed is:

1. An amplifier comprising:
    an input terminal configured to receive an input signal;
    an output terminal configured to drive an output signal;
    a first transistor comprising a first input contact coupled to the input terminal and a first output contact coupled to the output terminal;
    a second transistor including a second input contact coupled to the input terminal and a second output contact coupled to the first output contact of the first transistor and the output terminal;
    a current bias component, coupled to the first input contact of the first transistor, configured to provide a bias current to the first transistor and the second transistor along a same current path;
    a capacitor component, coupled between the first input contact of the first transistor and the second input contact of the second transistor, configured to short the input signal between the first input contact and the second input contact at an operating frequency range and provide the input signal to the first input contact and the second input contact; and
    a feedback path coupled between the output terminal and a first control contact of the first transistor or coupled between the output terminal and a second control contact of the second transistor, wherein the feedback path is configured to control a first bias to the first transistor or a second bias to the second transistor based on a reference voltage.

2. The amplifier of claim 1, further comprising:
    an inductor component coupled to the input terminal and configured to provide a DC path for the bias current.

3. The amplifier of claim 1, wherein the current bias component comprises a third transistor, an integrated resistor or an integrated inductor configured as a current source to provide the bias current to the first transistor and the second transistor along the same current path.

4. The amplifier of claim 1, wherein the output terminal is coupled at an output node located between the first output contact and the second output contact with a voltage potential between a first supply level and a second supply level that is different from the first supply level.

5. The amplifier of claim 1, wherein the feedback path comprises a common-mode feedback amplifier comprising:
    a first input coupled to the output terminal;
    a second input coupled to the reference voltage; and
    an output coupled to the first control contact or the second control contact, wherein the first control contact and the second control contact comprise gate contacts of the first transistor and the second transistor, respectively.

6. The amplifier of claim 1, wherein the first transistor and the second transistor are configured to both amplify the input signal and reuse a current along the same current path.

7. The amplifier of claim 1, wherein the first input contact and the second input contact comprise source contacts of the first transistor and the second transistor, and the first output contact and the second output contact comprise drain contacts, and wherein the first transistor and the second transistor comprise FET transistors of different PMOS and NMOS transistor types respectively.

8. The amplifier of claim 1, wherein the first transistor and the second transistor are coupled together in a common gate configuration as a current-reusing common-gate low-noise amplifier configured to vary an input impedance.

9. A communication system comprising:
    an input component configured to receive or transmit one or more input signals comprising:
        a baseband processor integrated on a single substrate configured to process the one or more input signals;
        an amplifier arranged in a common-gate configuration and configured to match an input impedance of the one or more input signals, the amplifier comprising:
            an amplifier input terminal configured to receive the one or more input signals;
            an amplifier output terminal configured to provide an output signal having a gain based on the one or more input signals;
            a push stage comprising a first transistor of a first transistor type coupled to a current supply via a current path;
            a pull stage comprising a second transistor of a second transistor type coupled to the push stage and to the current supply via the current path;
            a capacitor component, coupled between input contacts of the first transistor and the second transistor, configured to provide the one or more input signals at an operating frequency range to the push stage and the pull stage; and a feedback path coupled between the amplifier output terminal and a first gate contact of the first transistor or a second gate contact of the second transistor, wherein the feedback path is configured to control a first bias to the first transistor or a second bias to the second transistor based on a reference voltage.

10. The communication system of claim 9, wherein the first transistor comprises:

a first source contact coupled, via the capacitor component, to the amplifier input terminal and a second source contact of the second transistor; and a first drain contact coupled, via an output node, to a second drain contact of the second transistor;

wherein the amplifier is configured to provide the output signal at the amplifier output terminal via the output node with the gain that is based on a sum of a transconductance of the first transistor and the second transistor independent of a current consumption of the amplifier.

11. The communication system of claim 9, wherein the pull stage and the push stage are coupled to one another in a parallel configuration and configured to detect the one or more input signals concurrently.

12. The communication system of claim 9, wherein the amplifier is located externally to the single substrate.

13. The communication system of claim 9, wherein the feedback path comprises a common-mode feedback (CMFB) amplifier coupled to the amplifier output terminal at a first CMFB input, a reference voltage at a second CMFB input and a gate contact of the first transistor or the second transistor at a CMFB output.

14. The communication system of claim 13, wherein the CMFB amplifier is configured to generate a bias level of the output signal that is approximately at a middle level between a first supply level and a second supply level that is different from the first supply level.

15. The communication system of claim 9, wherein the first gate contact of the first transistor receives a different voltage bias than the second gate contact of the second transistor.

16. The communication system of claim 9, further comprises an inductor coupled to the amplifier input terminal configured to bias the received one or more input signals.

17. A mobile communication device comprising:

a transceiver component comprising at least one differential amplifier, comprising:

a differential input having a p-input and an n-input;

a differential output having an n-output and a p-output; and a first amplifier arranged between the p-input and the n-output and a second amplifier arranged between the n-input and the p-output, wherein the first amplifier and the second amplifier are in a common-gate configuration and respectively comprise:

an amplifier input connected to the p-input or to the n-input;

a push stage comprising a first transistor of a PMOS type that is coupled to a current bias;

a pull stage comprising a second transistor of an NMOS type coupled in parallel to the push stage in a common gate configuration and to a current supply via a same current input path as the first transistor; and a capacitor component including at least one capacitor, coupled between input contacts of the first transistor and the second transistor, configured to concurrently provide one or more input signals at an operating frequency range to the push stage and the pull stage.

18. The mobile communication device of claim 17, further comprising:

a first cross-coupling component configured to cross-couple a first capacitor between a first input contact of the first transistor of the amplifier and a first control contact of the first transistor of the second amplifier, and cross-couple a second capacitor between a first input contact of the first transistor of the second amplifier and a first control contact of the first transistor of the first amplifier;

a second cross-coupling component configured to cross-couple a third capacitor between a second input contact of the second transistor of the first amplifier and a second control contact of the second transistor of the second amplifier, and cross-couple a fourth capacitor between a second input contact of the second transistor of the second amplifier and a second control contact of the second transistor of the first amplifier.

19. The mobile communication device of claim 17, wherein the n-input and the p-input respectively comprise a biasing component that includes an inductor configured to provide a DC bias to the same current input path.

* * * * *